United States Patent
Ge et al.

(10) Patent No.: US 11,040,632 B2
(45) Date of Patent: Jun. 22, 2021

(54) INTERLEAVED VARIABLE VOLTAGE CONVERTER

(71) Applicant: Ford Global Technologies, LLC, Dearborn, MI (US)

(72) Inventors: Baoming Ge, Okemos, MI (US); Lihua Chen, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 457 days.

(21) Appl. No.: 15/997,528

(22) Filed: Jun. 4, 2018

(65) Prior Publication Data
US 2019/0366850 A1 Dec. 5, 2019

(51) Int. Cl.
| | |
|---|---|
| *H02M 1/32* | (2007.01) |
| *H02M 3/156* | (2006.01) |
| *H02P 27/06* | (2006.01) |
| *B60L 53/22* | (2019.01) |
| *H02M 3/158* | (2006.01) |
| *H01L 29/16* | (2006.01) |

(52) U.S. Cl.
CPC ............ *B60L 53/22* (2019.02); *H02M 3/158* (2013.01); *B60L 2210/10* (2013.01); *H01L 29/16* (2013.01); *H01L 29/1608* (2013.01)

(58) Field of Classification Search
USPC ........................................................ 307/10.1
See application file for complete search history.

(56) References Cited

U.S. PATENT DOCUMENTS

| | | | |
|---|---|---|---|
| 8,080,973 B2 | 12/2011 | King et al. | |
| 8,575,778 B2 | 11/2013 | Chen | |
| 9,290,097 B2 | 3/2016 | Steigerwald et al. | |
| 2006/0152085 A1* | 7/2006 | Flett ........................ | B60L 9/30 307/75 |
| 2008/0239775 A1* | 10/2008 | Oughton ............. | H02M 5/4585 363/134 |
| 2010/0071970 A1* | 3/2010 | Welchko ................. | B60K 1/00 180/65.1 |
| 2016/0020016 A1* | 1/2016 | Ouyang ................. | H02M 7/06 307/31 |
| 2019/0052168 A1* | 2/2019 | Bhandarkar ........ | H02M 3/1584 |

* cited by examiner

*Primary Examiner* — Rexford N Barnie
*Assistant Examiner* — Xuan Ly
(74) *Attorney, Agent, or Firm* — David B. Kelley; Brooks Kushman P.C.

(57) ABSTRACT

An interleaved DC-DC converter includes a non-gapped coupled inductor with first, second, and third windings. The converter also includes first, second, and third legs in parallel. The first leg has silicon carbide or silicon nitride switches, and the second and third legs have silicon switches. A controller modulates the switches of the first leg at a frequency greater than a frequency of the switches of the second and third legs.

7 Claims, 7 Drawing Sheets

INTERLEAVED VARIABLE VOLTAGE CONVERTER

TECHNICAL FIELD

This application is generally related to a variable voltage converter for a vehicular powertrain.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in particular voltage and current ranges. The traction battery is alternatively referred to as a high-voltage battery. During vehicular operation, the high-voltage components in the electric vehicle powertrain may be subject to stresses including over current or short circuit conditions.

Also, many electrified vehicles include a DC-DC converter, also referred to as a variable voltage converter (VVC), to convert the voltage of the traction battery to an operational voltage level of the electric machine. The electric machine may require a high voltage and high current. Due to the voltage, current and switching requirements, a solid-state switch such as an Insulated Gate Bipolar Transistor (IGBT) is typically used in the power inverter and the VVC. Similarly, components of the DC-DC converter may be subject to stresses including over current or short circuit conditions.

SUMMARY

A powertrain includes an interleaved DC-DC converter with first, second, and third legs in parallel and a non-gapped coupled inductor having first, second, and third windings. The first leg has silicon carbide or silicon nitride switches. The second and third legs have silicon switches. A controller modulates the switches of the first leg at a frequency greater than a frequency of the switches of the second and third legs.

A vehicle powertrain includes a battery and a DC-DC power converter. The power converter includes first, second, and third legs coupled in parallel, a DC inductor coupled between the battery and first, second, and third legs, and an AC non-gapped coupled inductor having first, second, and third windings coupled between the DC inductor and first, second, and third legs.

A vehicle powertrain includes a power converter and a controller. The power converter includes a non-gapped coupled inductor and first, second, and third legs. The first leg has silicon carbide or silicon nitride switches, and the second and third legs have silicon switches. The controller modulates the switches of the first leg at a frequency greater than that of the switches of the second and third legs.

DETAILED DESCRIPTION

Figure 1:
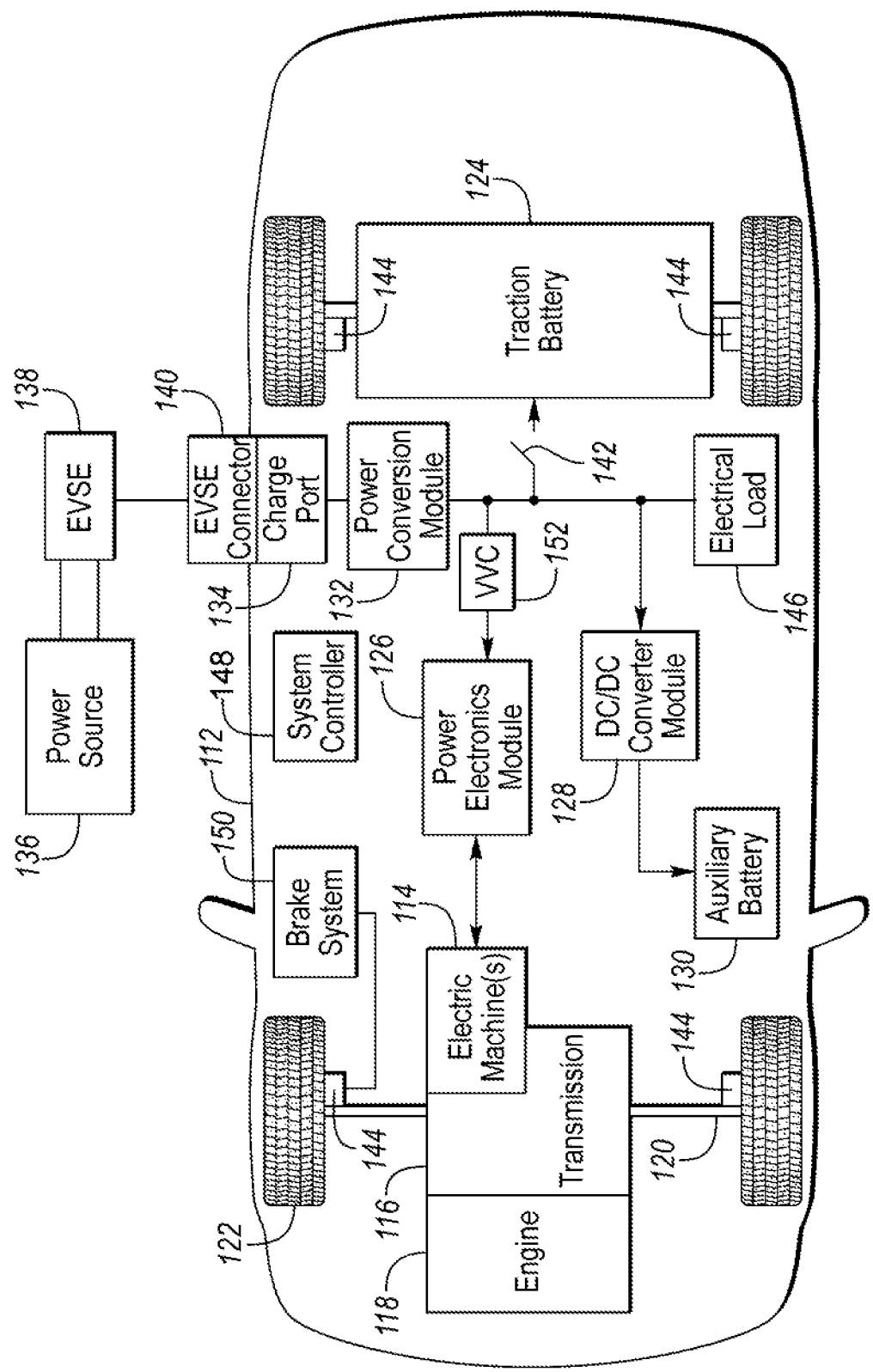
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Generally, solid-state devices (SSD), such as Insulated Gate Bipolar Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET are voltage controlled, in which the operation is based on a voltage applied to a gate of the IGBT or MOSFET, while operation of a BJT is current controlled, in which the operation is based on a current applied to a base of the BJT. Here, the use of a power device IGBT and a MOSFET will be discussed, however the structure and methods may be applicable to other SSDs. Operation of an IGBT is controlled by a gate voltage supplied by a gate driver.

Here, a bi-directional three-legged interleaved variable voltage converter is disclosed in which two legs are modulated at a common frequency and out of phase with each other (e.g., the first leg is 180° out of phase with the second leg) and the third leg is modulated at a frequency greater than the first and second leg (e.g., at 2 times the common frequency or 3 times the common frequency). Further, along with a DC inductor, two coupled AC inductors are used to help reduce a ripple current. The DC inductor is used to generate the DC voltage boost and the coupled AC inductors are used to reduce the ripple current. Also, the use of heterogeneous components (e.g., Silicon (Si), Silicon Carbide (SiC), Silicon Nitride (SiN), and Gallium Arsenic (GaAs)) may be used to further improve operation and different SSDs may be used in the different legs. For example, the first and second may use IGBTs while the third may use MOSFETs or BJTs. Due to the configuration and use of heterogeneous components, some components legs may carry more DC current than another leg. For example, a first and second using Si IGBTs combined may carry the same DC current as a third leg using SiC MOSFETs.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
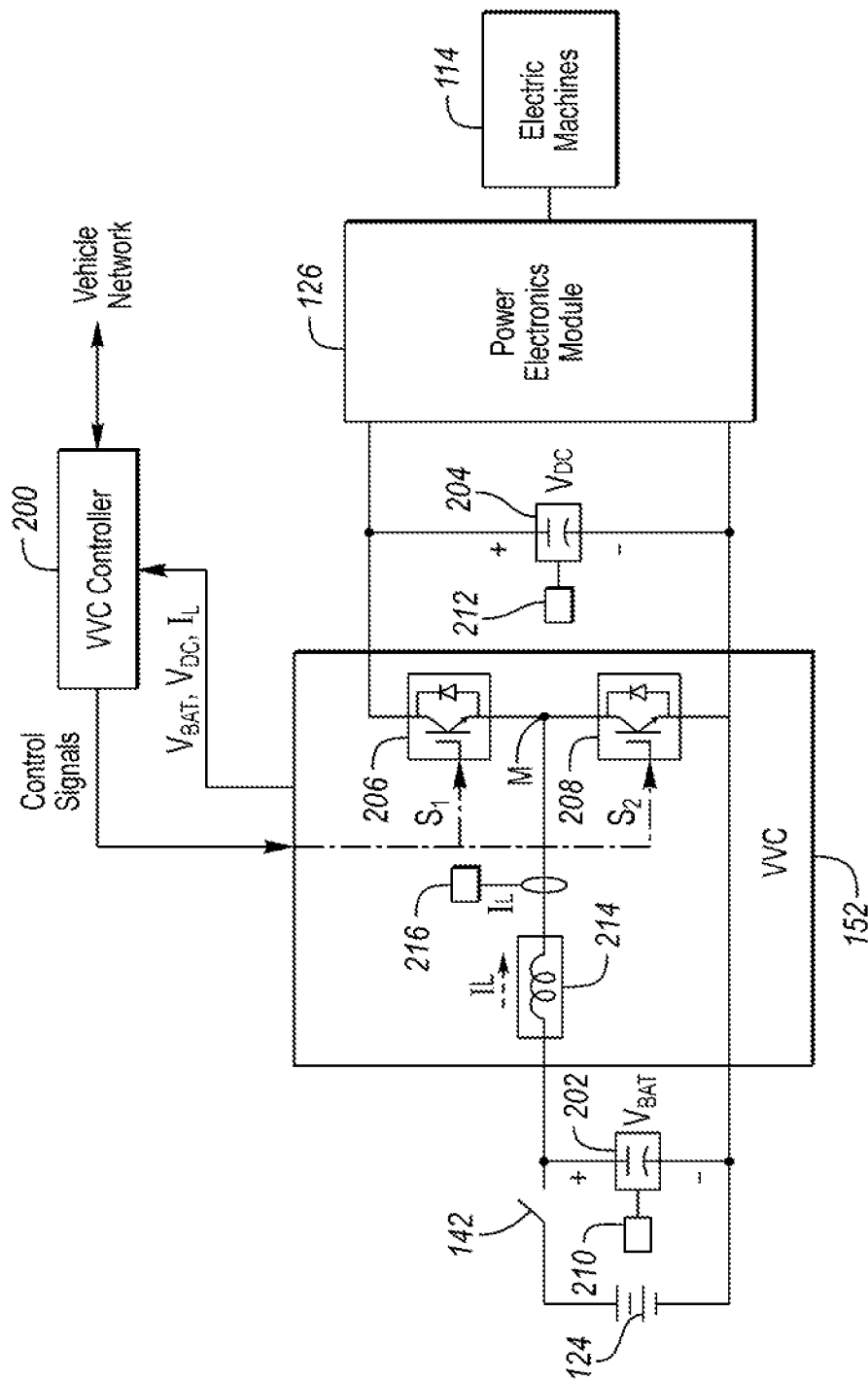
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad (1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{DC}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214, often referred to as a boost inductor, may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214, load power. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}*$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

The current that is controlled by the switching devices 206, 208 may include a ripple component that has a magnitude that varies with the duty cycle and switching frequency of the switching devices 206, 208. The magnitude of the ripple current is also related to the duty cycle.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios. The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

Since the ripple current is also affected by the duty cycle. The duty cycle may be determined based on a ratio of the input voltage to the output voltage. As such, the switching frequency may also be varied based on the ratio between the input voltage and the output voltage. The switching frequency may be changed in discrete steps or continuously over the duty cycle range.

Figure 3:
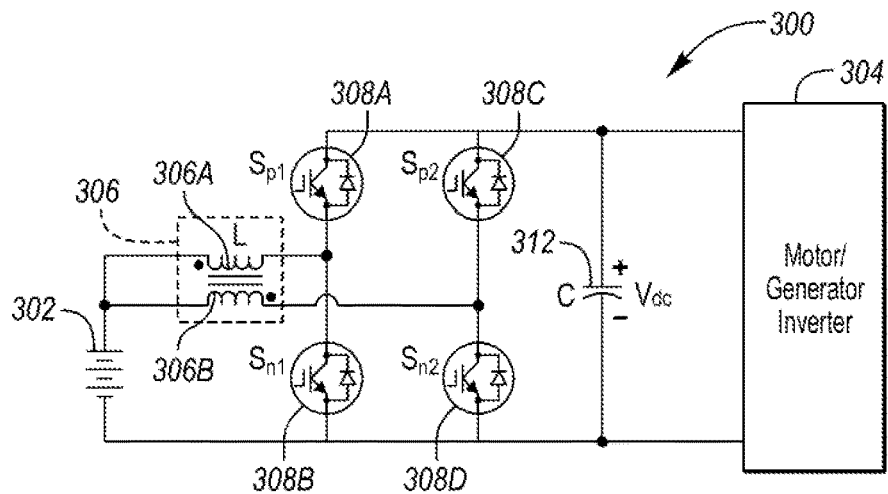
FIG. 3 is a schematic diagram of a coupled inductor interleaved variable voltage converter.

Variable voltage converters (VVCs) are used in Hybrid Electric Vehicles (HEVs) and Electric Vehicles (EVs). Generally, performance of a traction motor drive system is enhanced by the VVC's boost ability that steps-up a low battery voltage to a DC bus voltage that ensures a desired DC bus voltage regardless of what power the Motor/Generator drive is consuming or generating. Some high power/high current VVCs utilize multiphase inputs of the converter in a parallel configuration to extend current ratings. FIG. 3 is a schematic diagram of an interleaved VVC 300. A traction battery 302 is used to power a motor/generator drive system 304. The motor/generator drive system 304 includes at least one electric machine that may be configured as a motor, a generator, or either a motor/generator. The electric machine is coupled with the battery 302 via an inverter that converts the direct current (DC) power of the battery 302 to Alternating Current (AC) power to drive the motor, or convert the AC power from the generator to DC power to charge the battery 302. In some implementations, a separate motor and generator are used. An inductive device 306 (i.e., a first inductor 306A and second inductor 306B) is coupled to a first leg (i.e., 308A and 308B) and a second leg (i.e., 308C and 308D). The interleaved variable voltage converter 300 further includes a DC capacitor 312 to provide bulk capacitance. In this schematic diagram, the inductive device 306 includes a first inductor 306A and second inductor 306B that are inductively coupled via a core, however in other implements the two inductors may not be directly inductively coupled but may be independent inductors. As this system includes 2 legs, the switches (i.e., 308A, 308B, 308C, and 308D) of each leg is typically driven out of phase to reduce ripple. The use of interleaved VVC technology generally reduces battery current ripple. Here, the coupled inductor may be implemented using a smaller size/footprint when compared with the use of individual inductors (not shown). Traditionally these topologies are configured such that all phase legs in parallel have the same switching frequency to achieve the interleaved control.

Figure 4:
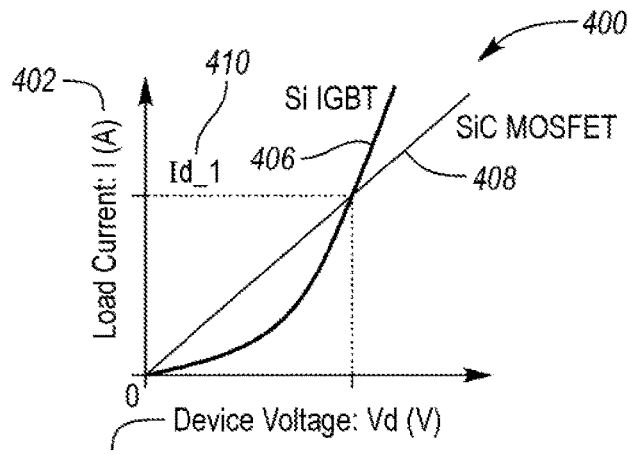
FIG. 4 is a graphical illustration of load current in relation to device voltage for a Silicon Insulated Gate Bipolar Transistor (IGBT) and a silicon carbide (SiC) Metal Oxide Semiconductor Field Effect Transistor (MOSFET).

In addition to the use of an interleaved VVC configuration, the use of alternative component materials may be used to further increase efficiency. For example, FIG. 4 is a graphical illustration 400 of load currents 402 of semiconductor components with respect to device voltage 404. From this representation, a comparison of a silicon (Si) Insulated Gate Bipolar Transistor (IGBT) 406 with a Silicon Carbon (SiC) Metal Oxide Semiconductor Field Effect Transistor (MOSFET) 408 may be viewed. The comparison illustrates advantages of the SiC-MOSFET over the Si-IGBT including higher-switching frequency, lower switching power loss, higher-operating temperature, and a higher breakdown voltage. Regarding conduction loss, FIG. 4 illustrates I-V curves of a SiC-MOSFET and a comparable Si-IGBT. When the drain current is less than Id_1 410, the SiC-MOSFET 408 has a lower drain-source voltage than that of the Si-IGBT 406. Thus, a SiC-MOSFET may have a lower conduction loss than Si-IGBT when a current is less than a threshold current 410. This feature allows a SiC-MOSFET based converters to have a higher efficiency and lower volume than a Si-IGBT based converter.

However, as shown in FIG. 4, when a drain current exceeds the current threshold 410, a SiC-MOSFET 408 may have a higher drain-source voltage than that of Si-IGBT 406. As a result, the SiC-MOSFET 408 may have a higher conduction loss than the Si-IGBT 406 when a current is higher than the threshold 410. Therefore, it is advantageous to operate a SiC-MOSFET in a current level less than the threshold 410 to achieve low conduction loss, and a Si-IGBT in a current level greater than the threshold 410. One other aspect is cost, as SiC-MOSFETs are generally more expensive than Si-IGBTs.

Often systems use homogeneous component materials, (i.e., all semiconductor devices use the same base materials (i.e., silicon/Si)). Here, a system is disclosed using heterogeneous component materials (i.e., semiconductor devices use the different base materials (i.e., silicon/Si, Silicon Carbide/SiC)).

Here a Si-IGBT/SiC-MOSFET hybrid/heterogeneous VVC is shown which makes tradeoff between performance and cost of Si-IGBTs and SiC-MOSFETs. In particular, the hybrid VVC utilizes the high switching frequency ability of SiC-MOSFETs to reduce passive components size such as inductors and capacitors and the low loss of SiC devices helps to achieve high efficiency. Partial use of SiC devices and Si-IGBTs in the hybrid VVC provides a balance between performance and cost. To optimize performance of a hybrid VVC, different switching frequencies may be employed to optimally utilize advantages of the SiC MOSFETs and Si-IGBTs.

Figure 5:
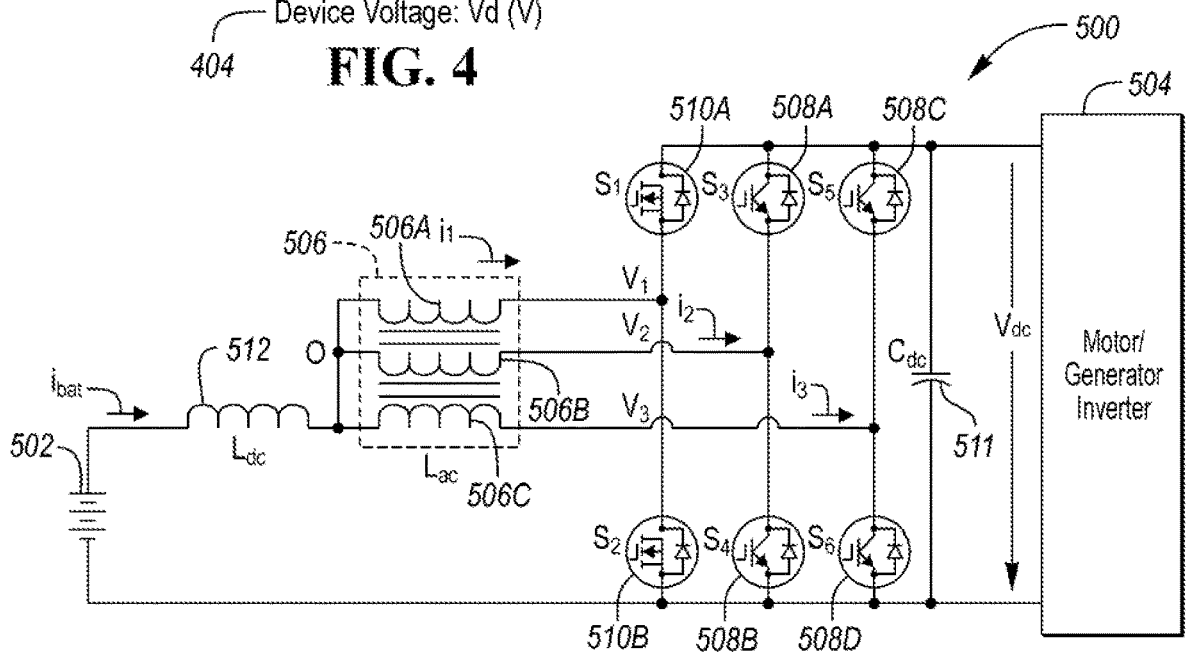
FIG. 5 is a schematic diagram of a coupled inductor three-legged interleaved variable voltage converter.

FIG. 5 is a schematic diagram of a coupled inductor three-legged interleaved variable voltage converter 500. A traction battery 502 is used to power a motor/generator drive system 504. The motor/generator drive system 504 includes at least one electric machine that may be configured as a motor, a generator, or either a motor/generator. The electric machine is coupled with the battery 502 via an inverter that converts the direct current (DC) power of the battery 502 to Alternating Current (AC) power to drive the motor, or convert the AC power from the generator to DC power to charge the battery 502. In some implementations, a separate motor and generator are used. An inductive device 506 (i.e., a first inductor 506A, second inductor 506B, and third inductor 506C) is coupled to a first leg (i.e., 510A and 510B), a second leg (i.e., 508A and 508B), and a third leg (i.e., 508C and 508D). The three-legged interleaved variable voltage converter 500 further includes a DC capacitor 511 to provide capacitance. In this schematic diagram, the inductive device 506 includes a first inductor 506A, a second inductor 506B and a third inductor 506C through which all DC current flows.

FIG. 5 may be implemented heterogeneously in which switches S1 510A and S2 510B are SiC-MOSFETs, while switches S3 508A-S6 508D are Si-IGBTs. The phase leg of S3 508A and S4 508B, the phase leg of S5 508C and S6 508D, and the phase leg of S1 510A and S2 510B are connected in parallel to DC bus through the three phases coupled inductor Lac (i.e., 506A, 506B and 506C) that is in series with Ldc 512. The phase leg of S1 510A and S2 510B carries current $I_1$. The other two-phase legs of S3 508A-S6 508D carry currents of $I_2$ that flows through inductor 506B and $I_3$ that flows through inductor 506C. As a result, the combination of SiC-MOSFETs and Si-IGBTs provide a lower total VVC cost when compared with full SiC VVC implementation. In addition, the use of a phase leg of SiC-MOSFETs to carry part of input current (i.e., battery current) can be configured to limit SiC device current to less than the threshold point 410 and to reduce conduction loss during operation. FIG. 5 can be configured such the high switching frequency ability of SiC MOSFETs can be used to reduce inductor size. For example, a 20 kHz switching frequency of SiC MOSFETs can be used while a 10 kHz switching frequency for the Si-IGBTs is used to reduce IGBT loss.

Figure 6:
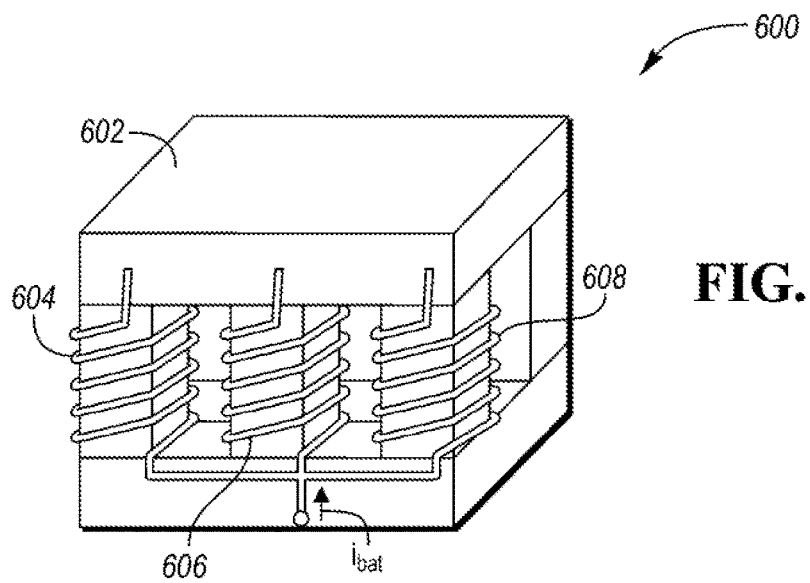
FIG. 6 is a graphical illustration of a coupled inductor for a coupled inductor variable voltage converter.
Figure 10:
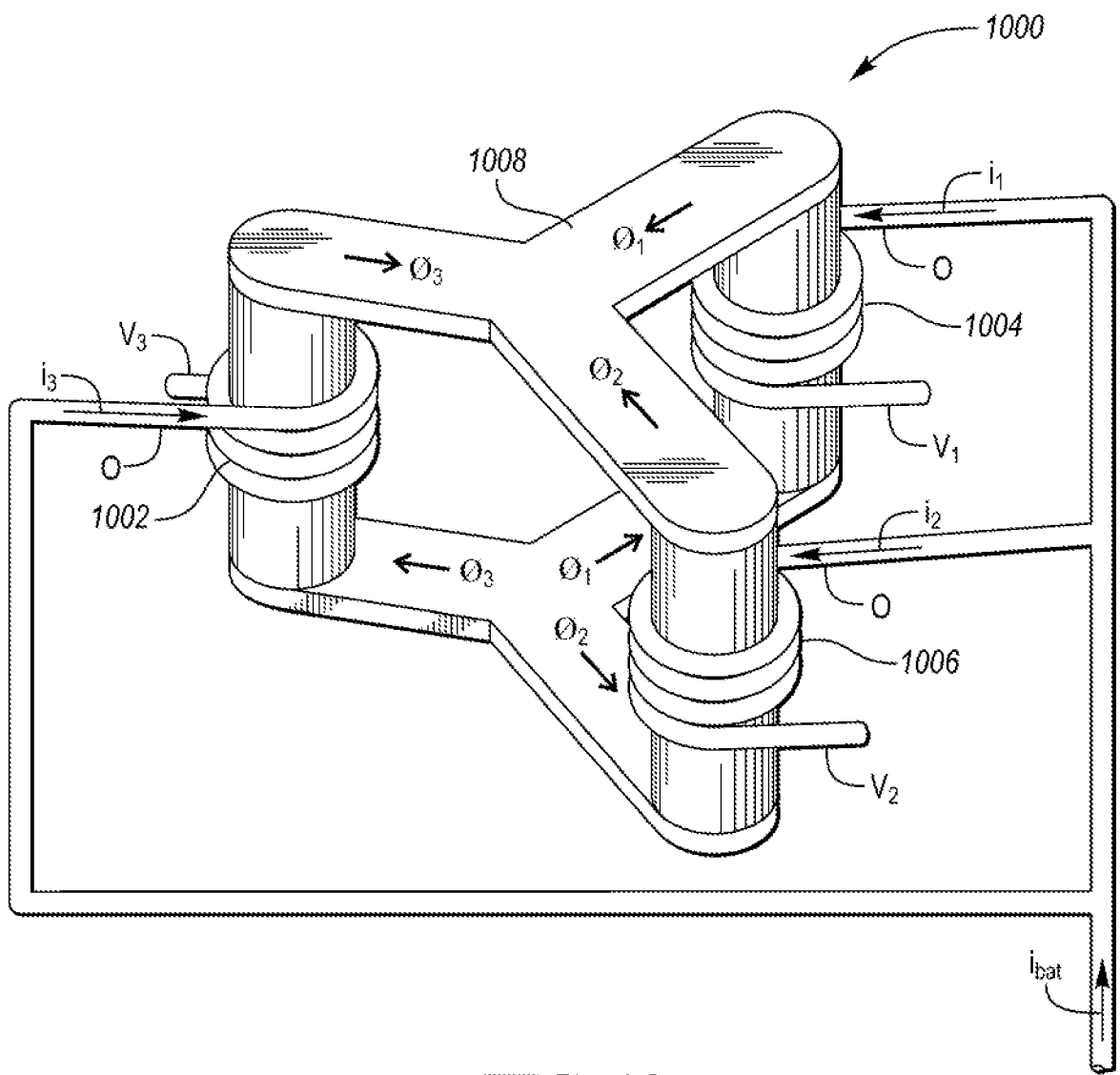
FIG. 10 is a three-dimensional perspective view of a three-winding coupled inductor.

FIG. 6 illustrates a coupled inductor having an air gap in the core to handle a DC flux component. Use of an air gaped coupled inductor allows the removal of the dc inductor $L_{dc}$ 512 shown in FIG. 5. The air gap may be implemented by adding an actual "air gap" in the core or by adding a virtual "air gap" using different core materials. An example may be when the three outer legs associated with the windings 604, 606, and 608 use a ferrite core while the common leg 602 uses a powdered iron core. The permeability of the ferrite core is several hundred times higher than that of the powdered iron core. However, the use of an air gap design results in the coupled inductor being larger in size than the coupled inductor without air gap. FIG. 10 illustrates a coupled inductor design without air gap. When using the coupled inductor of FIG. 10, the dc inductor $L_{dc}$ shown in FIG. 5 should be included.

Figure 7:
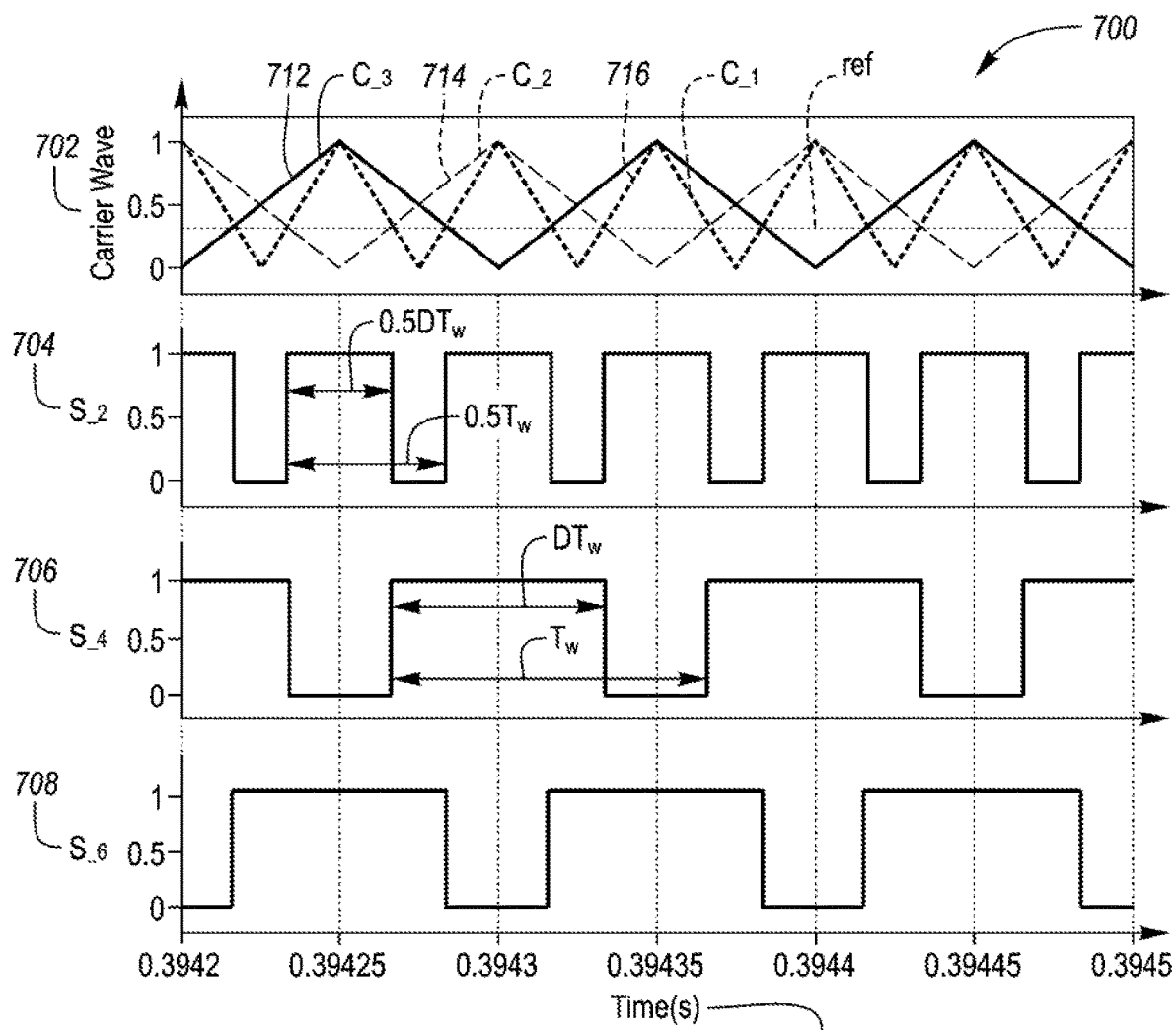
FIG. 7 is a graphical illustration of characteristics of the coupled inductor three-legged variable voltage converter of FIG. 5 with respect to time.

FIG. 7 is a graphical illustration 700 of characteristics (e.g., modulation methods) of the coupled inductor three-legged variable voltage converter of FIG. 5 with respect to time 710. The characteristics include a carrier waveform amplitude 702, and a first leg low-side switch gate voltage 704, a second leg low-side switch gate voltage 706, and a third leg low-side switch gate voltage 708. A first carrier wave 716, a second carrier wave 714, and a third carrier wave 712 are plotted in relation to time 710 each having a magnitude based on the carrier waveform amplitude 702. The first carrier wave 716 is associated with the first leg (i.e., 510A and 510B), the second carrier wave 714 is associated with the second leg (i.e., 508A and 508B), and the third carrier wave 712 is associated with the third leg (i.e., 508C and 508D).

FIG. 7 is an example modulation method for a three-legged interleaved VVC (e.g., the VVC of FIG. 5). Here, the first carrier wave 716 (c_1) is the SiC-MOSFET phase leg's carrier wave with frequency of 2fw, the second carrier wave 714 and third carrier wave 712 (i.e., c_2 and c_3) are the Si-IGBT phase legs' carrier waves, both having a frequency of fw. When the third carrier wave 712 (c_3) is used as a base, the second carrier wave 714 (c_2) has 180° phase shift, and the first carrier wave 716 (c_1) also has 180° phase shift at a frequency of 2fw. When the reference signal ref compares with the first 716, second 714, and third carrier wave 712 (c_1, c_2, and c_3), the gate drive signals S_2 704 for the SiC-MOSFET phase leg, S_4 706 and S_6 708 for the two IGBT phase legs are generated by at least one controller. The controller may set the duty cycle D equal to 1-ref to ensure that the VVC boosts the output voltage Vdc from battery voltage Vb, according to the relationship expressed by equation 2

$$v_{dc} = \frac{1}{1-D} v_b \quad (2)$$

In which the voltage $V_O$ in FIG. 5 is expressed by equation 3

$$v_O \simeq \frac{V_1 + V_2 + V_3}{3} \quad (3)$$

Figure 8:
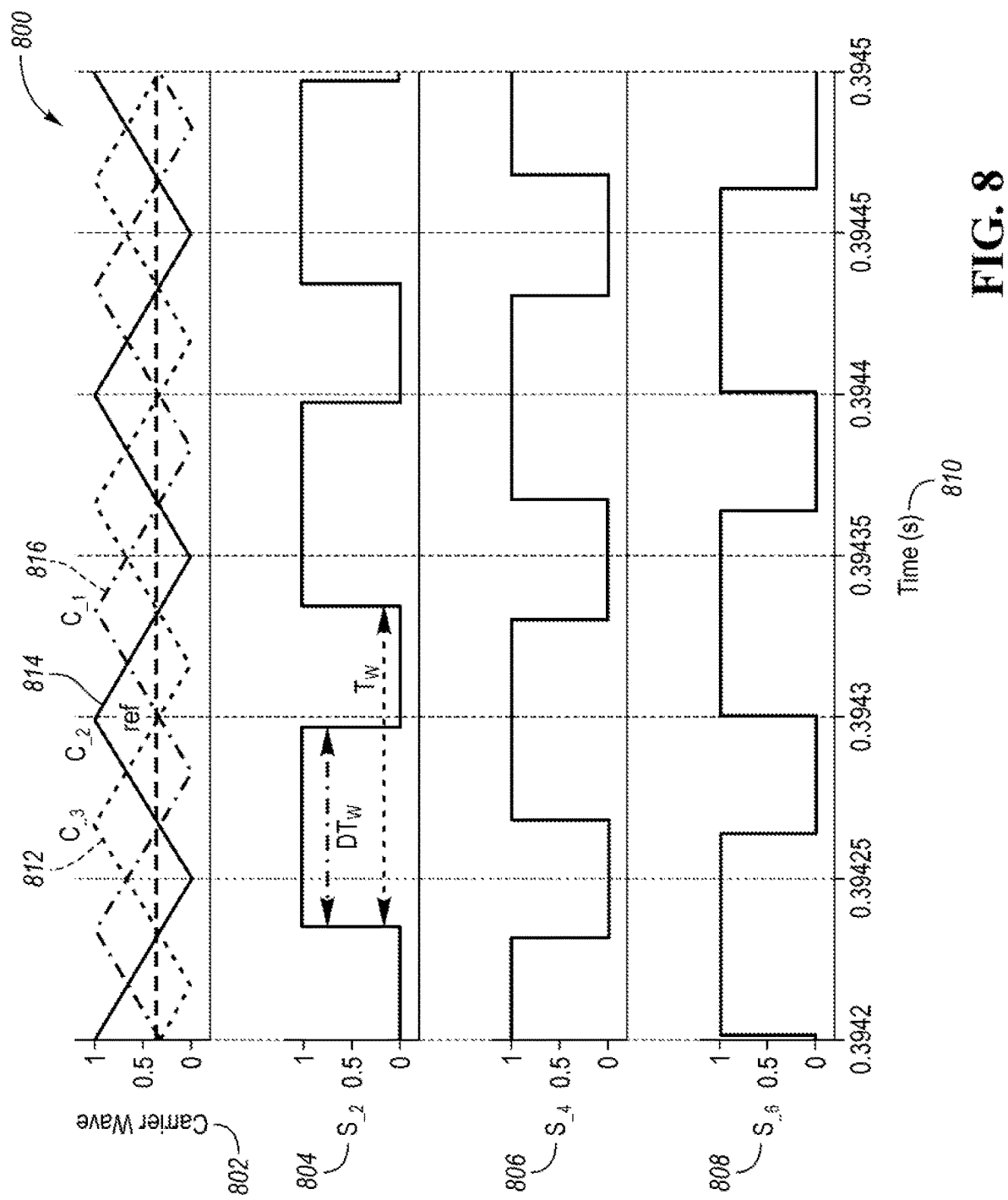
FIG. 8 is a graphical illustration of characteristics of the coupled inductor three-legged variable voltage converter of FIG. 5 with respect to time.

FIG. 8 is a graphical illustration 800 of characteristics (e.g., modulation methods) of the coupled inductor three-legged variable voltage converter similar to the embodiment of FIG. 5 with respect to time 810. The embodiment of FIG. 5 for this modulation method may be implemented heterogeneously in which switches S1 510A and S2 510B are SiC-MOSFETs, while switches S3 508A-S6 508D are Si-IGBTs, or other combinations. Also the embodiment of FIG. 5 for this modulation method may have homogeneous switches, for example, all the switches 508 and 510 may be Si IGBTs or all the switches 508 and 510 may be SiC MOSFETs. The characteristics include a carrier waveform amplitude 802, and a first leg low-side switch gate voltage 804, a second leg low-side switch gate voltage 806, and a third leg low-side switch gate voltage 808. A first carrier wave 816, a second carrier wave 814, and a third carrier wave 812 are plotted in relation to time 810 each having a magnitude based on the carrier waveform amplitude 802. The first carrier wave 816 is associated with the first leg (i.e., 510A and 510B), the second carrier wave 814 is associated with the second leg (i.e., 508A and 508B), and the third carrier wave 812 is associated with the third leg (i.e., 508C and 508D).

FIG. 8 is an example modulation method for a three-legged interleaved VVC (e.g., the VVC of FIG. 5). Here, the first carrier wave 816 (c_1) is at the same frequency as the second carrier wave 814 and third carrier wave 812 (i.e., c_2 and c_3). This modulation method may be for a homogeneous system in which all phase legs are Si IGBTs or SiC MOSFETs, as well as for a heterogeneously system in which switches S1 510A and S2 510B are SiC-MOSFETs, while switches S3 508A-S6 508D are Si-IGBTs. As the carrier waves are all at a common frequency (fw), each of the carrier waves 816 (c_1), 814 (c_2), and 812 (c_3) have a 1200 phase shift. When the reference signal ref compares with the first 816, second 814, and third carrier wave 812 (c_1, c_2, and c_3), the gate drive signals S_2 804, S_4 806, and S_6 808 for the three switch phase legs are generated by at least one controller. The controller may set the duty cycle D equal to i-ref to ensure that the VVC boosts the output voltage Vdc from battery voltage Vb, according to the relationship expressed by equation 2 above. In which the voltage $V_O$ in FIG. 5 has frequency of 3fw.

Figure 9:
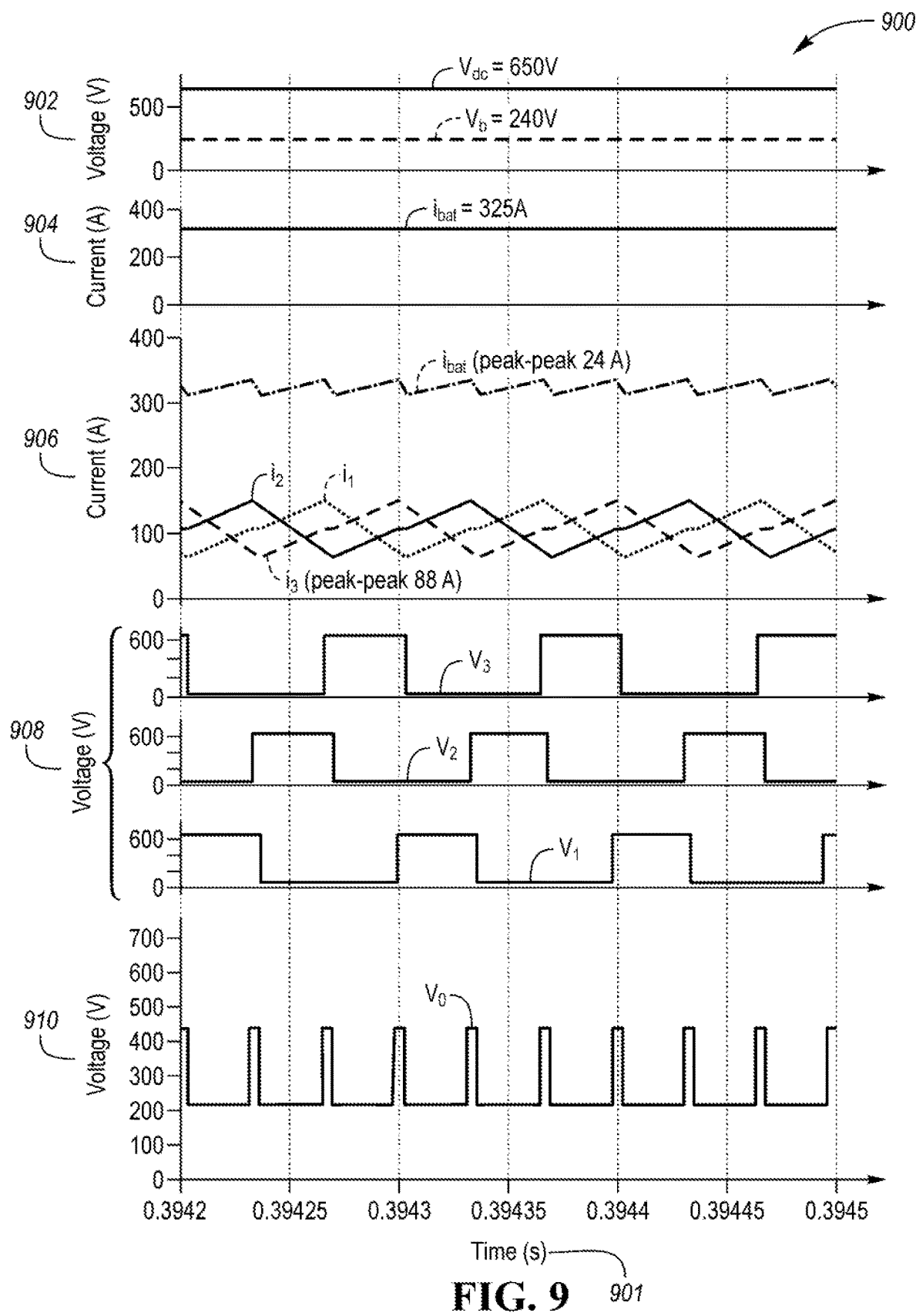
FIG. 9 is graphical illustrations of output voltages of a DC inductor in the coupled inductor three-legged variable voltage converter of FIG. 5 with respect to time.

FIG. 9 is a graphical illustration of characteristics 900 of the coupled inductor interleaved three-legged variable voltage converter of FIG. 5 with respect to time. The characteristics include an input and output voltages 902 ($V_b$ and $V_{dc}$), a DC battery current 904, DC currents 906 (phase currents $i_1$, $i_2$, and $i_3$ and the battery current $i_{bat}$), the leg voltages 908 ($V_1$, $V_2$, and $V_3$), and the dc inductor output voltage 910 $V_o$.

The modulation method illustrated here was with converter parameters of Ldc=30 µH, Lac=120 µH, Cdc=1000 µF, Vb=240 V. The DC bus voltage was boosted to 650 V from input battery voltage of 240 V through a duty cycle setting of D=0.631. The input power was approximately 78 kW delivering the demand power of load motor. The switching frequency is 10 kHz. The DC bus voltage Vdc was approximately 650 V, in which a battery current ibat was an average value of approximately 325 A with the battery voltage Vb of 240V. As shown in FIG. 9, DC bus voltage $V_{dc}$ is 650 V, battery current $i_{bat}$ presents an average value of 325 A with battery voltage $V_b$ of 240 V. FIG. 9 shows ripple currents of $i_{bat}$, $i_1$, $i_2$, and $i_3$. FIG. 9 shows output voltages $V_1$, $V_2$, and $V_3$ of three phase legs. FIG. 9 shows output voltage $V_O$ of three phases coupled inductors $L_{ac}$. It can be seen that ripple currents of $i_1$, $i_2$ and $i_3$ are 88 A peak-peak, but they are cancelled each other, as a result that battery current shows 24 A peak-peak ripple, which is a significant reduction. From FIG. 9, the pulse of voltage $V_O$ has a frequency of 30 kHz, which is three times switching frequency of 10 kHz. Also, peak value of voltage $V_O$ is much less than DC bus voltage of 650 V. These two points make a big contribution to reduce DC inductor $L_{dc}$ in FIG. 5.

FIG. 10 is a three-dimensional perspective view of a three-winding coupled inductor 1000 for a coupled inductor interleaved variable voltage converter. The three-winding coupled inductor 1000 includes a first winding 1004, a second winding 1006, and a third winding 1002 each wrapped around a leg of the core 1008. The core may be a ferromagnetic material such as a ferrous metal, Nickel, Cobalt, or tin. The configuration is such that a flux induced in one leg cancels fluxes in the other two legs. Applying a voltage $V_1$ across the windings 1004 creates flux $\Phi_1$ from a current $i_1$ that flows up thru the core 1008 to cancel the fluxes $\Phi_2$ and $\Phi_3$ from a currents $i_2$ and $i_3$ based on voltages $V_2$ a $V_3$.

Figure 11:
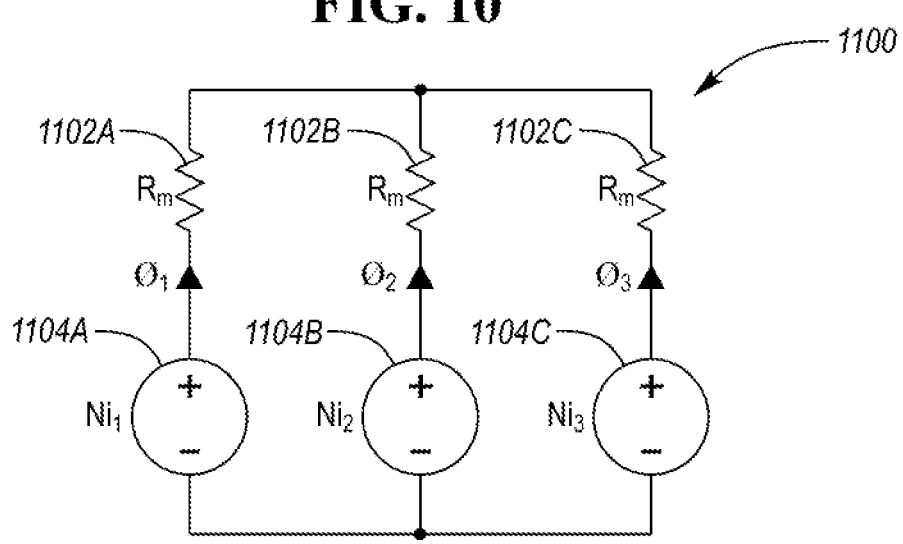
FIG. 11 is a schematic diagram of a magnetic circuit model for the three-winding coupled inductor of FIG. 10.

FIG. 11 is a schematic diagram of a magnetic circuit model for the three-winding coupled inductor of FIG. 10. Each leg has a respective magnetic reluctance $R_m$ 1102 (e.g., 1102A, 1102B, and 1102C), Magnetomotive force 1104 (e.g., 1104A, 1104B, and 1104C), and flux $\Phi$ (e.g., $\Phi_1$, $\Phi_2$, and $\Phi_3$). This circuit illustrates schematically that a flux induced in one leg cancels fluxes in the other two legs. There is no DC flux component in core fluxes □1, □2, and □3 which only have high frequency flux generated by current ripples of i1, i2, and i3. This point makes core size reduced and air gap eliminated.

FIG. 10 is a graphical illustration of a coupled inductor 1000 for a coupled inductor interleaved variable voltage converter. The coupled inductor Lac (i.e., 506A, 506B, and 506C) from FIG. 5 is configured such that the cores have no air gaps. FIG. 10 illustrates a battery current $I_{bat}$ which splits into each of the coupled inductors (506A, 506B, and 506C), each having the same DC component, therefore not creating a DC flux component inside the coupled inductor Lac core 1008 that just handles high frequency flux components from current ripple through each winding (506A, 506B, and 506C). Therefore, there is no need to have air gap in the core. As a result, core size and winding turns may be reduced to achieve the same inductance when compared with the gapped inductor.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle powertrain comprising:
   a battery;
   a DC-DC power converter including first, second, and third legs coupled in parallel, a DC inductor coupled between the battery and first, second, and third legs, and an AC non-gapped coupled inductor having first, second, and third windings coupled between the DC inductor and first, second, and third legs; and
   a controller configured to modulate switches of the second leg out of phase with switches of the third leg, and to modulate switches of the first leg at twice the frequency of the second and third legs such that a maximum carrier wave of the third leg coincides with that of the first leg and is opposite the second leg.

2. The vehicle powertrain of claim 1, wherein the controller is further configured to modulate switches of the third leg at three times the frequency of the first leg such that a maximum carrier wave of the third leg coincides with that of the first and second legs.

3. The vehicle powertrain of claim 1, wherein the first leg includes silicon carbide or silicon nitride switches and the second and third legs include silicon switches.

4. The vehicle powertrain of claim 1, wherein the silicon switches include insulated gate bipolar transistors and the silicon carbide or silicon nitride switches include metal oxide semiconductor field effect transistors.

5. The vehicle powertrain of claim 1, wherein the non-gapped coupled inductor is configured such that a first DC flux from the first winding cancels a second DC flux from the second winding or a third DC flux from the third winding.

6. A vehicle powertrain comprising:
   a power converter including a non-gapped coupled inductor and first, second, and third legs, the first leg having silicon carbide or silicon nitride switches, and the second and third legs having silicon switches, wherein the silicon carbine or silicon nitride switches are metal oxide semiconductor field effect transistors and the silicon switches are insulated gate bipolar transistors; and
   a controller configured to modulate the switches of the first leg at a frequency greater than that of the switches of the second and third legs, and to modulate the switches of the third leg at three times the frequency of the first leg such that a maximum carrier wave of the third leg coincides with that of the first and second legs.

7. The vehicle powertrain of claim 6, wherein the controller is further configured to modulate the switches of the first leg at two times the frequency of the switches of the second and third legs such that a maximum carrier wave of the third leg coincides with that of the first leg and is opposite with the second leg.

* * * * *